(12) United States Patent
Smith et al.

(10) Patent No.: US 6,894,938 B2
(45) Date of Patent: May 17, 2005

(54) SYSTEM AND METHOD OF CALIBRATING A READ CIRCUIT IN A MAGNETIC MEMORY

(75) Inventors: Kenneth Kay Smith, Boise, ID (US); Frederick A. Perner, Palo Alto, CA (US); Richard L. Hilton, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/678,322

(22) Filed: Oct. 3, 2003

(65) Prior Publication Data

US 2005/0073890 A1 Apr. 7, 2005

(51) Int. Cl.⁷ ............................................... G11C 29/00
(52) U.S. Cl. ...................................... 365/201; 365/158
(58) Field of Search ................................. 365/201, 158

(56) References Cited

U.S. PATENT DOCUMENTS

| | | |
|---|---|---|
| 6,188,615 B1 | 2/2001 | Perner et al. |
| 6,262,625 B1 | 7/2001 | Perner et al. |
| 2003/0023928 A1 * | 1/2003 | Jedwab et al. .............. 714/763 |
| 2004/0062104 A1 * | 4/2004 | Muller et al. ............... 365/201 |

* cited by examiner

*Primary Examiner*—Huan Hoang

(57) ABSTRACT

A system and method of calibrating a read circuit in a magnetic memory is disclosed. In one embodiment, the method includes measuring a calibration value. A large error calibration is performed if the calibration value is within a maximum range. A small error calibration is performed if the calibration value is within a minimum range. The method may include performing a first read operation on the magnetic memory, and performing a second read operation on the magnetic memory.

26 Claims, 7 Drawing Sheets

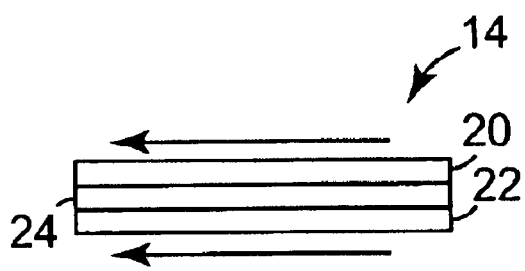
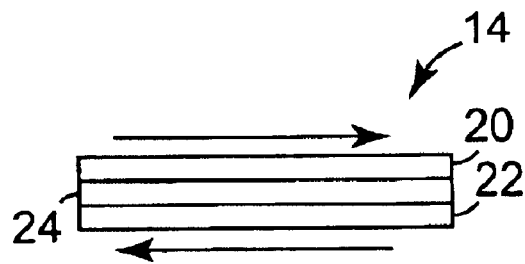
Fig. 2A  Fig. 2B
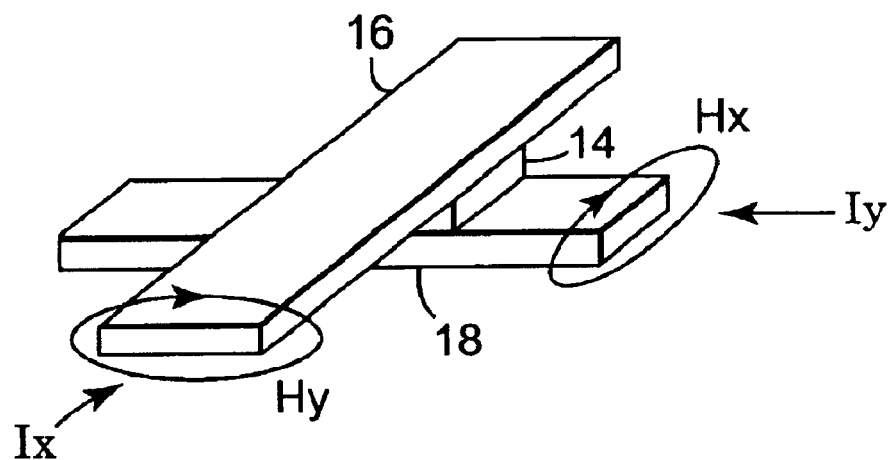
Fig. 3

SYSTEM AND METHOD OF CALIBRATING A READ CIRCUIT IN A MAGNETIC MEMORY

BACKGROUND OF THE INVENTION

Magnetic random access memory (MRAM) is a type of non-volatile magnetic memory which includes magnetic memory cells. A typical magnetic memory cell includes a layer of magnetic film in which the magnetization of the magnetic film is alterable and a layer of magnetic film in which magnetization is fixed or "pinned" in a particular direction. The magnetic film having alterable magnetization is typically referred to as a data storage layer, and the magnetic film which is pinned is typically referred to as a reference layer.

A typical magnetic memory includes an array of magnetic memory cells. Word lines extend along rows of the magnetic memory cells, and bit lines extend along columns of the magnetic memory cells. Each magnetic memory cell is located at an intersection of a word line and a bit line. A magnetic memory cell is usually written to a desired logic state by applying external magnetic fields that rotate the orientation of magnetization in its data storage layer. The logic state of a magnetic memory cell is indicated by its resistance state which depends on the relative orientations of magnetization in its data storage and reference layers. A sense amplifier is used to sense the resistance state of a selected magnetic memory cell to determine the logic state stored in the memory cell. The resistance state can be sensed by applying a voltage to a selected memory cell and measuring a sense current that flows through the memory cell. Ideally, the resistance is proportional to the sense current.

Sensing the resistance state of a single memory cell in the array can be unreliable. The memory cells in the array are coupled together through many parallel paths. The resistance at one cross point equals the resistance of the memory cell at that cross point in parallel with resistances of memory cells in the other word lines and bit lines. Memory cells located along the same word line or bit line typically each see similar resistances.

Various approaches have been proposed to calibrate magnetic memory read circuits to help minimize the effect of these parasitic resistances. Typically these approaches perform a calibration by measuring correction parameters for a memory cell at a particular location within the array of memory cells. The measured correction parameters are then applied to other memory cell locations across the array. While these approaches can improve the reliability of sensing a memory cell in the array, the variation of the parasitic resistances and currents across the array, and especially between different bit lines, can still cause result in unreliable read operations.

SUMMARY OF THE INVENTION

The present invention provides a system and method of calibrating a read circuit in a magnetic memory. In one embodiment, the method comprises measuring a calibration value. A large error calibration is performed if the calibration value is within a maximum range. A small error calibration is performed if the calibration value is within a minimum range. The method may include performing a first read operation on the magnetic memory and performing a second read operation on the magnetic memory.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIGS. 2A and 2B are diagrams illustrating parallel and anti-parallel magnetization of a magnetic memory cell.

FIG. 3 is a diagram illustrating a magnetic memory cell that has been selected during a write operation.

DETAILED DESCRIPTION

Figure 1:
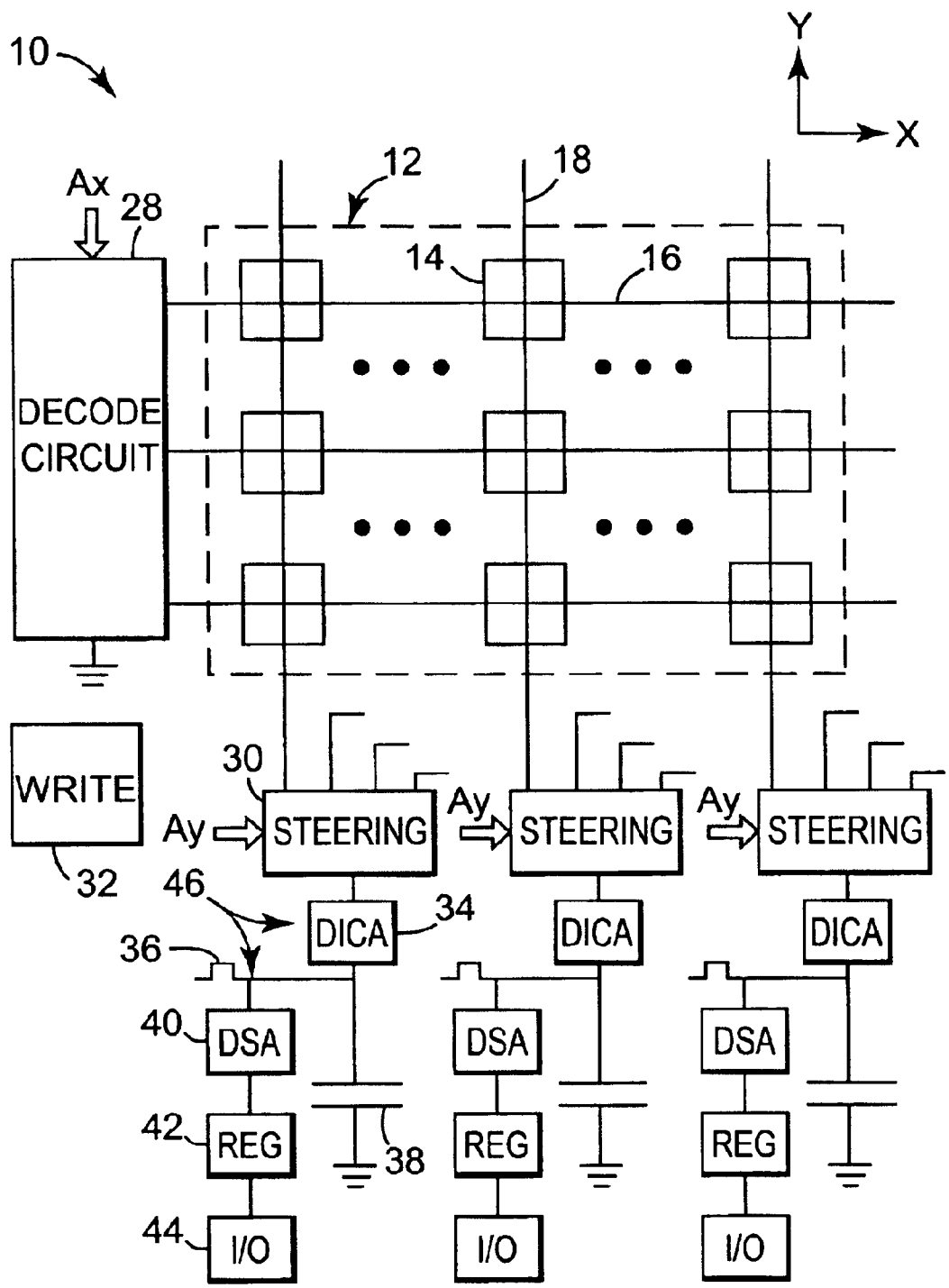
FIG. 1 is a diagram illustrating an exemplary embodiment of a magnetic memory according to the present invention.

FIG. 1 is a diagram illustrating an exemplary embodiment of a magnetic memory 10. The magnetic memory 10 may provide a method of calibrating read circuits which improves the reliability of read operations. The magnetic memory cells 14 are arranged in rows and columns, with the rows extending along an x-direction and the columns extending along a y-direction. Only a relatively small number of magnetic memory cells 14 are shown to simplify the description of the invention. In other embodiments, the array 12 is any suitable size. In other embodiments, the array 12 may utilize highly parallel modes of operation, such as 64-bit wide or 128-bit wide operation.

In one embodiment, word lines 16 extend along the x-direction in a plane on one side of array 12 and bit lines 18 extend along the y-direction in a plane on an adjacent side of array 12. In one embodiment, there is one word line 16 for each row of array 12 and one bit line 18 for each column of array 12. In the embodiment illustrated in FIG. 1, magnetic memory cell 14 is located at an intersection or cross point of a word line 16 and a bit line 18.

The magnetic memory cells 14 are not limited to any particular type of device. Magnetic memory cells 14 may be, for example, spin dependent tunneling junction devices, anisotropic magnetoresistance devices, giant magnetoresistance devices, colossal magnetoresistance devices, extraordinary magnetoresistance devices or very large magnetoresistance devices.

In the exemplary embodiment, magnetic memory 10 includes a row decoder 28, a read circuit 46 and a write circuit 32. Row decoder 28 selects word lines 16 during read and write operations. A word line 16 may be selected during a read operation by connecting that word line 16 to ground.

Read circuit 46 senses the resistance of selected memory cells 14 during read operations. The read circuit 46 includes direct injection charge amplifiers 34, digital sense amplifiers 40, reset switches 36 and integrator capacitors 38. A memory cell 14 is selected by supplying a row address Ax to the row decoder 28 and a column address Ay to steering circuits 30. In response to the row address Ax, the row decoder 28 couples a word line 16 to ground. In response to the column address Ay, a steering circuit 30 couples a bit line 18 to a charge amplifier 34. A selected memory cell 14 lies at the cross point of selected word and bit lines 16 and 18.

Write circuit 32 orients the magnetization of the selected memory cells 14 during write operations. The write circuit 32 is not shown in detail in order to simplify the explanation of the invention.

Figure 5:
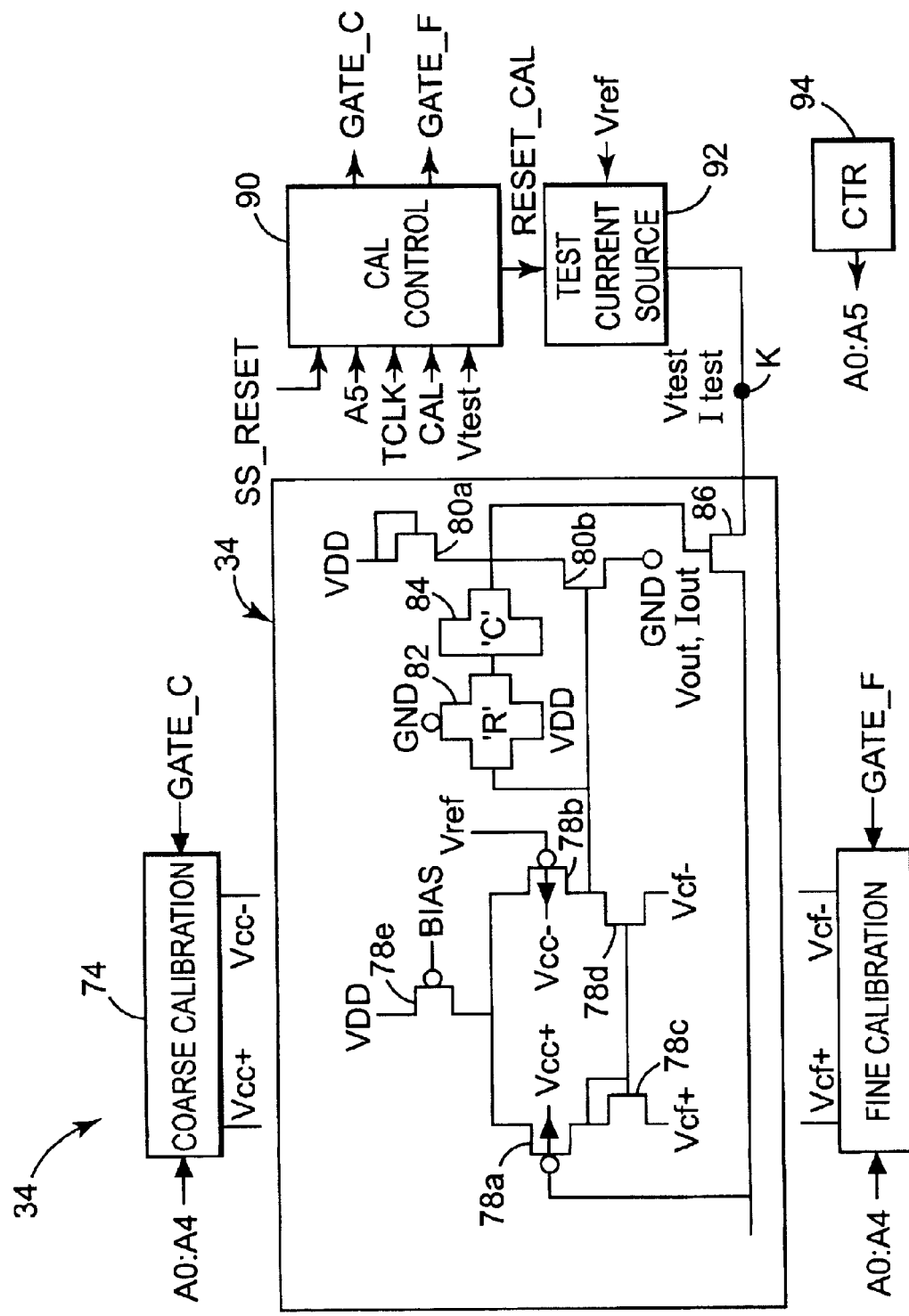
FIG. 5 is a diagram illustrating one embodiment of a direct injection charge amplifier having digital offset calibration.

In the exemplary embodiment, for a selected column of memory cells, the direct injection charge amplifier 34 supplies a current to the corresponding integrator capacitor 38 while maintaining a potential on the non-selected memory cells 14 of the selected bit line 18 (see also, FIG. 5). This potential is equal to the potential applied to non-selected rows and columns of the array 12. As the charge amplifier 34 applies a fixed voltage to the selected bit line 18, a resulting constant sense current is supplied to the integrator capacitor 38. The digital sense amplifier 40 measures signal integration time. The signal integration time is partly a function of the resistance of the selected memory cell 14, which is either at a first state R or a second state R+ΔR. The digital sense amplifier 40 can determine the resistance state of the memory cell 14 and, therefore, the logic value stored in the memory cell 14 by comparing the signal integration time to one or more thresholds. An output of the digital sense amplifier 40 is supplied to an output register 42 which, in turn, is coupled to an I/O pad 44 of the magnetic memory 10.

In the exemplary embodiment, the read circuit 46 reads out data in m-bit words, whereby the resistance states of a number m of memory cells 14 are sensed simultaneously. For example, a first group of k contiguous bit lines 18 can be multiplexed into a first charge amplifier 34, a second group of k contiguous bit lines 18 can be multiplexed into a second charge amplifier 34, and so on. An m-bit word might be read out by operating m consecutive sense/charge amplifiers 40/34 simultaneously. If a single digital sense amplifier 40 is multiplexed to sixty-four columns, and data is stored as 16-bit words, sixteen sense amplifiers 40 could be used for a 1024 by 1024 array 12 of memory cells 14. A total of k=64 bit lines 18 would be multiplexed into each charge amplifier 34.

In the exemplary embodiment, each steering circuit 30 includes a set of switches that connect each bit line 18 to either a constant voltage source or a charge amplifier 34. Each steering circuit 30 further includes a column decoder. The column decoder selects only one switch for connecting the selected bit line 18 to the charge amplifier 34. All other (unselected) bit lines 18 are connected to the constant voltage source. In one embodiment, the constant voltage source is supplied from an external circuit.

FIGS. 2A and 2B are diagrams illustrating parallel and anti-parallel magnetization of a magnetic memory cell. In one embodiment, magnetic memory cell 14 is a spin dependent tunneling device. Magnetic memory cell 14 includes a magnetic layer referred to as data storage layer 20, a magnetic layer referred to as reference layer 22, and a tunnel barrier 24 disposed between data storage layer 20 and reference layer 22. Data storage layer 20 is referred to as a free layer because it has a magnetization orientation that is not pinned and which can be oriented in either of two directions along an easy axis which lies in a plane. Reference layer 22 is referred to as a pinned layer because it has a magnetization that is oriented in a plane but is fixed so as not to rotate in the presence of an applied magnetic field within a range of interest. The magnetization orientation assumes one of two stable orientations at any given time which are the parallel and anti-parallel orientations.

FIG. 2A illustrates by arrows the parallel orientation when the magnetization of the free and pinned layers 20 and 22 are in the same direction along the easy axis. With parallel orientation, the orientation of magnetization in the data storage layer 20 is substantially parallel to the magnetization in the reference layer 22 along the easy axis and magnetic memory cell 14 is in a low resistance state which can be represented by the value R. FIG. 2B illustrates by arrows the anti-parallel orientation when the magnetization of the free and pinned layers 20 and 22 are in opposite directions. With anti-parallel orientation, the orientation of magnetization in the data storage layer 20 is substantially anti-parallel to the magnetization in the reference layer 22 along the easy axis and magnetic memory cell 14 is in a high resistance state which can be represented by the value R+ΔR. The insulating tunnel barrier 24 allows quantum mechanical tunneling to occur between the free and pinned layers 20 and 22. Because the tunneling is electron spin dependent, the resistance of magnetic memory cell 14 is a function of the relative orientations of the magnetization of the free and pinned layers 20 and 22.

Data is stored in the magnetic memory cell 14 by orienting the magnetization along the easy axis of the free layer 20. In one embodiment, a logic value of "0" is stored in magnetic memory cell 14 by orienting the magnetization of free layer 20 such that the magnetization orientation is parallel, and a logic value of "1" is stored in magnetic memory cell 14 by orienting the magnetization of free layer 20 such that the magnetization orientation is anti-parallel. In another embodiment, a logic value of "1" is stored in magnetic memory cell 14 by orienting the magnetization of free layer 20 such that the magnetization orientation is parallel, and a logic value of "0" is stored in magnetic memory cell 14 by orienting the magnetization of free layer 20 such that the magnetization orientation is anti-parallel.

FIG. 3 is a diagram illustrating a magnetic memory cell 14 that has been selected. In one embodiment, the magnetization in free layer 20 of selected magnetic memory cell 14 is oriented by supplying the currents Ix and Iy to conductors 16 and 18 which cross selected magnetic memory cell 14. Supplying the current Ix to word line 16 causes a magnetic field Hy to form around conductor 16. Supplying the current Iy to bit line 18 causes a magnetic field Hx to form around bit line 18. When sufficiently large currents Ix and Iy are passed through word line 16 and bit line 18, the magnetic fields Hx and Hy in the vicinity of free layer 20 cause the magnetization of free layer 20 to rotate from the parallel orientation to the anti-parallel orientation, or to rotate from the anti-parallel orientation to the parallel orientation.

In one embodiment, a magnetic memory cell 14 is read by applying sense currents to word line 16 and bit line 18. Magnetic memory cell 14 will have either a resistance of R or a resistance of R+ΔR, depending on whether the orientation of magnetization of the free and pinned layers 20 and 22 is parallel or anti-parallel as illustrated in FIGS. 2A and 2B.

Figure 4:
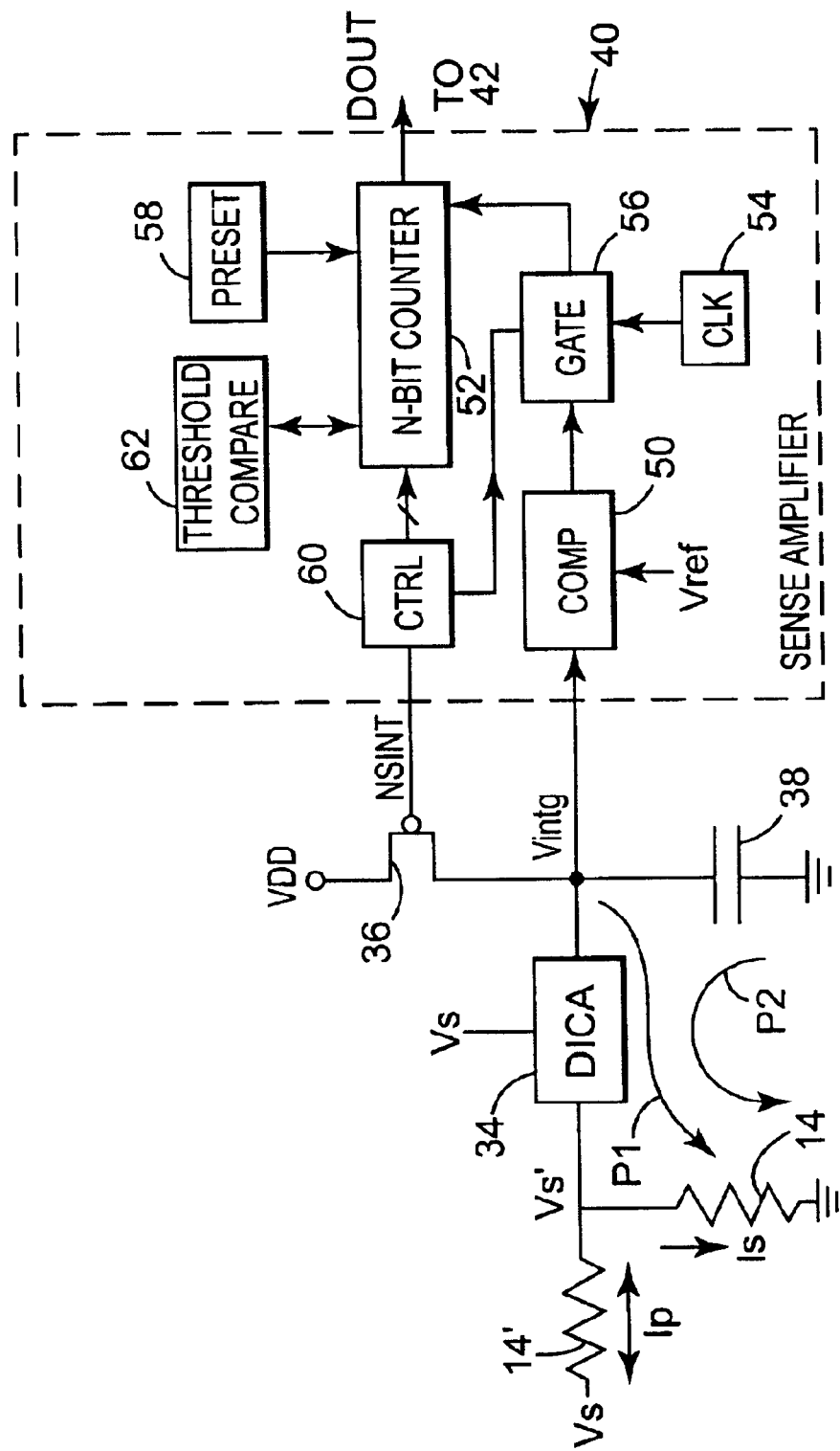
FIG. 4 is a diagram illustrating one embodiment of a sense amplifier.

FIG. 4 is a diagram illustrating one embodiment of a sense amplifier 40 during a read operation of a selected memory cell 14. Sense amplifier 40 supplies a control signal NSINT which controls whether the reset switch 36 is on (conducting) or off (not conducting). In the illustrated embodiment, the reset switch 36 is a PMOS transistor. In other embodiments, the reset switch 36 can be other types or combinations of transistors. In the illustrated embodiment, when the reset switch 36 is turned on into a conductive mode, a supply voltage VDD is applied to the integrator capacitor 38 and to the selected memory cell 14 through the direct injection charge amplifier 34. The integrator capacitor 38 is charged as a first current follows a first path P1, wherein the first current is conducted through the reset switch 36 and the selected memory cell 14. The selected memory cell 14 is represented by a resistor. When the reset switch 36 is turned off into a nonconductive mode, the sense current (Is) conducted through the selected memory cell 14 is supplied from the integrator capacitor 38. The second (sense) current follows a second path P2, and is conducted from the integrator capacitor 38 through the selected memory cell 14. The second current includes currents from the selected memory cell 14 and any parasitic currents from the array 12. The parasitic currents (Ip) from the array 12 can arise because voltages (Vs') applied to the unselected memory cells 14 (illustrated at 14') are not precisely equal to the applied array voltage (Vs). As long as the integrator voltage (Vintg) is greater than the voltage across the selected memory cell 14, the capacitor 38 functions as a linear integrator.

In the illustrated embodiment, the direct injection charge amplifier 34 controls a sense voltage Vs' across the memory cells 14 which is independent of the second (sense) current. When a constant voltage equal to the voltage Vs applied to the array 12 is applied to all memory cells 14 on the selected bit line (that is, an equipotential voltage is applied across the memory cells 14), variations in resistance will not cause a current variation across the remaining parallel memory elements 14, and the parasitic sense currents can be made substantially less than the second (sense) current. Direct injection charge amplifier 34 maintains the voltage Vs' across selected memory cell 14 at a value equal to Vs so that the voltage Vs–Vs' across unselected memory cells 14' and therefore the parasitic currents Ip are minimized. The current that flows in the direct injection charge amplifier 34 is then directly proportional to the resistance of the selected memory cell 14 without having to make corrections or adjustments for variations in the sense voltage Vs'. The direct injection charge amplifier 34 includes a high gain negative feedback amplifier for controlling the selected bit line voltage (that is, the sense voltage Vs) to a set value and minimizing the variance of the sense voltage Vs' over a wide range of sense currents (see also, FIG. 5).

In the illustrated embodiment, the resistance of the memory cell 14 and the capacitance of integrator capacitor 38 determine how quickly the integrator capacitor 38 is discharged after reset switch 36 is opened. All other parameters being equal, the integrator capacitor 38 will discharge more quickly when the memory cell 14 has a resistance of R (for example, a logic "0"), than when the memory cell 12 has a resistance of R+ΔR (for example, a logic "1").

In the illustrated embodiment, the sense amplifier 40 measures the integration time to determine the resistance state of the selected memory cell 14 and, therefore, the logic value stored in the selected memory cell 14. The sense amplifier 40 includes a comparator 50 for comparing capacitor voltage Vintg to a DC reference voltage Vref. The sense amplifier 40 further includes an N-bit counter 52, a high frequency clock 54 and a gate 56. The gate 56 is used to start and stop the clock 54, and the clock 54 causes the counter 52 to increment a counter value at clock frequency. If the clock 54 is started when the reset switch 36 is turned off, and the clock 54 is stopped when the capacitor voltage Vintg equals the reference voltage Vref, the counter value stored in the counter 52 will indicate the amount of time for the voltage Vintg on the integrator capacitor 38 to decay to the reference voltage Vref.

An N-bit preset register 58 is included which can temporarily store the contents of the counter 52 and which can load the preset register 58 contents into the counter 52. The preset register 58 can also be loaded with specific values such as for initialization or for 2's complement addition. In other embodiments, the specific values can be supplied from the I/O pads of magnetic memory 10.

A controller 60 is included to control the reset switch 36, counter 52, gate 56, preset register 58 and threshold compare logic 62. Under control of the controller 60, the read circuit 46 can operate under different modes which include read operations and measurement of the calibration values. In other embodiments, the different modes are selected by supplying signals to the I/O pads of magnetic memory 10.

In one embodiment, before a read operation is performed, the negative of a threshold is preloaded into the counter 52. After the read operation, the most significant bit of the counter value represents the logic value stored in the selected memory cell 14. An output DOUT of the most significant bit of the counter 52 is coupled to the register 42.

In one embodiment, before the read operation is performed, the counter 52 is initialized to a value of zero. After the read operation, the magnitude of the counter value is compared to threshold values representing a logic "0" and a logic "1" to determine the logic value stored in the selected memory cell 14. An output DOUT representing the logic value is coupled to the register 42.

In the illustrated embodiment, when the calibration value of the read circuit 46 is measured, a read operation is performed and the calibration value corresponds to the counter value stored in counter 52 after a read operation is performed. The calibration value corresponds to the amount of time for the voltage Vintg on the integrator capacitor 38 to decay to the reference voltage Vref, wherein the calibration value corresponds to the amount of time.

The sense amplifier 40 includes threshold compare logic 62. The threshold compare logic 62 stores maximum range and minimum range values. In the illustrated embodiment, a large error calibration of the read circuit 46 is performed if a calibration value is within a maximum range. A small error calibration of the read circuit 46 is performed if the calibration value is within a minimum range.

The maximum range includes a maximum upper threshold value and a maximum lower threshold value. The large error calibration of the read circuit is performed if the calibration value is greater than the maximum upper threshold value or less than the maximum lower threshold value. The minimum range includes a minimum upper threshold value and a minimum lower threshold value. The small error calibration of the read circuit is performed if the calibration value is equal to or greater than the maximum lower threshold value and less than the minimum lower threshold value, or is greater than the minimum upper threshold value and equal to or less than the maximum upper threshold value.

The large error calibration and the small error calibration both optimize or match the performance of the components which are coupled to selected and unselected rows or columns and which can adversely affect read performance of the read circuit. In one embodiment, the large error calibration and the small error calibration correct for unintended current leakage resulting from unselected rows which are coupled to selected columns, where the unselected rows are coupled to unselected components such as memory cells which can provide current leakage paths.

In one example embodiment, the circuit parameters of magnetic memory 10 are sized to accommodate a sense current range of 200 nA to 500 nA, a power supply voltage VDD of 3.3V, a reference voltage Vref of 1.0 volts, a clock 54 having a clock frequency of 100 MHz, and a counter 52 that is 9-bits wide. The minimum DC sense current of 200 nA determines the capacitance C of the integrator capacitor 38 for a 2.3V swing (VDD-Vref) in 512 levels, with each clock tick equaling 10 nanoseconds. A sense current Is of 400 nA represents a reference logic "1" and a sense current Is of 350 nA represents a reference logic "0". These sense current values correspond to a counter value (CNT) that is dependent upon the frequency of the clock 54, the voltage swing (VDD-Vref), and the capacitance of the integrator capacitor 38. In the example embodiment, a reference logic "1" corresponds to 255 counter ticks (i.e., 0,011,111,111), and a reference logic "0" corresponds to 292 counter ticks (i.e., 0,100,100,100). A midpoint counter value corresponds approximately to 273 counter ticks (i.e., 0,100,010,001).

The maximum lower threshold value, minimum lower threshold value, minimum upper threshold value and the maximum upper threshold value correspond to counter values stored in threshold compare logic 62. In the example embodiment, minimum threshold values are selected to be approximately 2% of the counter value midpoint between a logic "0" and a logic "1" (e.g. 5 counter ticks), and maximum threshold values are selected to be approximately 10% of the counter value midpoint (e.g. 27 counter ticks). In other embodiments, other suitable threshold values can be used.

In an example embodiment illustrating the calibration of read circuit 46 while reading a logic "0", the large error calibration of the read circuit for a logic "0" read is performed if the calibration value is greater than a maximum upper threshold value of 300 counter ticks or less than a maximum lower threshold value of 228 counter ticks. The small error calibration of the read circuit for a logic "0" read is performed if the calibration value is equal to or greater than a maximum lower threshold value of 228 counter ticks and less than a minimum lower threshold value of 250 counter ticks, or is greater than a minimum upper threshold value of 260 counter ticks and equal to or less than a maximum upper threshold value of 300 counter ticks. The large error calibration and the small error calibration are not performed and the read "0" is valid if the calibration value is equal to or greater than 250 counter ticks and equal to or less than 260 counter ticks. In other embodiments, other suitable values for a valid read and for the maximum lower threshold values the minimum lower threshold value, the minimum upper threshold value and the maximum upper threshold value can be used. In other embodiments, the values for a valid read and for the maximum lower threshold value, the minimum lower threshold value, the minimum upper threshold value and the maximum upper threshold value are supplied from the I/O pads of magnetic memory 10. In other embodiments, the calibration of read circuit 46 can be performed while reading a logic "1".

The sense amplifier 40 may be disclosed in U.S. Pat. No. 6,188,615 to Pemer et al., issued Feb. 13, 2001, entitled "MRAM Device Including Digital Sense Amplifiers," which is incorporated herein by reference.

FIG. 5 is a diagram illustrating one embodiment of a direct injection charge amplifier 34 having digital offset calibration. The direct injection charge amplifier 34 includes a large error calibration circuit which is illustrated as a coarse calibration circuit 74, and includes a small error calibration circuit which is illustrated as a fine calibration circuit 76. The direct injection charge amplifier 34 includes a PMOS differential amplifier. First, second and third PMOS transistors 78a, 78b and 78e and first and second NMOS transistors 78c and 78d of the differential amplifier provide a controlled current path. The substrate is common to the NMOS transistors 78c and 78d. However, the PMOS transistors 78a and 78b are located in isolated n-type wells in the substrate which allow the back gate bias of the first and second PMOS transistors 78a and 78b to be controlled. Arrows extending through gates of the PMOS transistors 78a and 78b schematically represent connections to the substrate.

The differential amplifier is followed by a second stage amplifier circuit including two transistors 80a and 80b for boosting the gain so that the output can be controlled to a desired value when the feedback loop is closed. The feedback loop includes the first PMOS transistor 78a, followed by the second stage operational amplifier circuit 80a and 80b and a current source transistor 86. The feedback signal is the output voltage Vout and the loop is closed when the output voltage Vout is applied to the gate of the first PMOS transistor 78a.

As a consequence of working with a high gain amplifier, closed loop stability becomes an issue. Frequency compensation components (a resistor-capacitor compensation circuit 82, 84) controls the stability of the second stage operational amplifier circuit by reducing high frequency gain of the second stage amplifier circuit and thereby preventing the closed loop operational amplifier from going unstable.

The current source transistor 86 has a gate coupled to an output of circuit 82/84 and a drain to source path coupled to an input of the differential amplifier. In a normal operation mode, the direct injection charge amplifier 34 senses and controls the output voltage Vout to a prescribed value by adjusting the current in the current source transistor 86 and then holding the current in the current source transistor 86 constant for a period of time.

The coarse calibration circuit 74 performs coarse offset correction. The coarse calibration circuit 74 performs the coarse correction by applying a back gate bias voltage Vcc+ and Vcc− to the isolated wells of the first and second PMOS transistors 78a and 78b. The level of the back gate bias voltage Vcc+ and Vcc− is set according to a first digital number which is stored in the coarse calibration circuit 74. The sensitivity of the offset voltage to back gate voltage variations can be rather large. Therefore, applying the back gate bias voltage Vcc+ and Vcc− is better suited for making coarse corrections to the offset voltage.

The fine calibration circuit 76 performs fine offset correction. The fine correction is performed by adjusting impedance of the transistors 78a, 78b, 78c, 78d and 78e in the differential amplifier. The amount of the impedance adjustment is determined by a second digital number, which is stored in the fine calibration circuit 76.

The direct injection charge amplifier 34 may be as disclosed in U.S. Pat. No. 6,262,625 to Pemer et al., issued Jul. 17, 2001, entitled "Operational Amplifier with Digital Offset Calibration," which is incorporated herein by reference.

Figure 6:
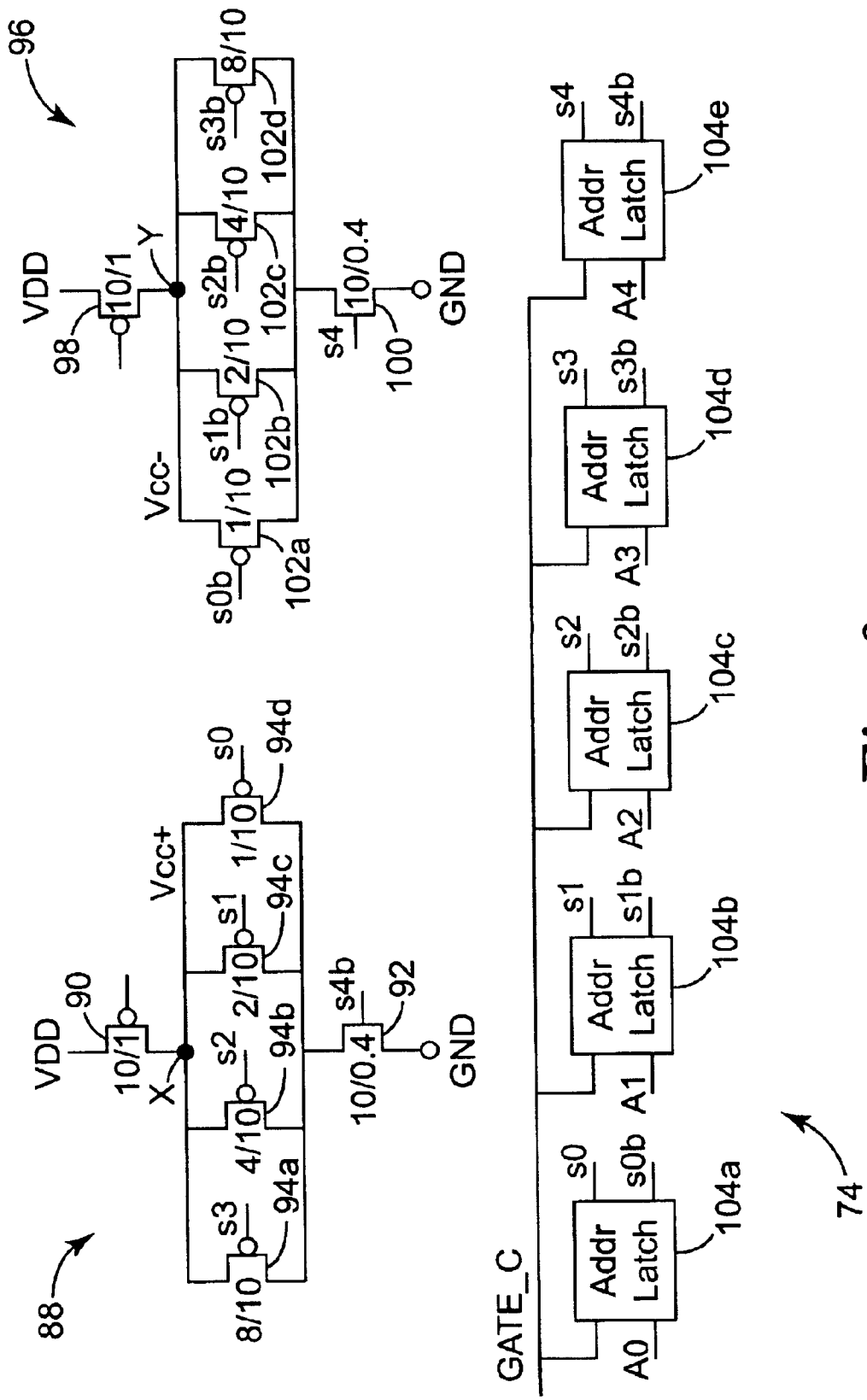
FIG. 6 is a diagram illustrating one embodiment of a coarse calibration circuit for the amplifier illustrated in FIG. 5.

FIG. 6 is a diagram illustrating one embodiment of a coarse calibration circuit 74 for the direct injection charge amplifier 34 illustrated in FIG. 5. The coarse calibration circuit 74 includes a pair of programmable voltage dividers 88 and 96 for developing the back gate bias voltage Vcc+ and Vcc− for the isolated wells of the PMOS transistors 78a and 78b. Each voltage divider 88 and 96 is connected between a source of operating potential (VDD) and a reference potential (GND).

The first voltage divider 88 is shown, by way of example, as being formed by upper and lower transistors 90 and 92, and four middle transistors 94a, 94b, 94c and 94d having different drain to source path resistances. The numbers 1/10, 2/10, 4/10 and 8/10 represent transistor length and width sizes. The transistor size variations set the voltage divider ratios. Turning on different combinations of the middle transistors 94a, 94b, 94c and 94d will change the voltage drop Vcc+between a first node X and ground GND. The voltage drop Vcc+is applied to the isolated well of the first PMOS transistor 78a.

The second voltage divider 96 also includes upper and lower transistors 98 and 100, and four middle transistors 102a, 102b, 102c and 102d having different drain to source path resistances. Turning on different combinations of the middle transistors 102a, 102b, 102c and 102d will change the voltage drop Vcc− between a second node Y and ground GND. The voltage drop Vcc− is applied to the isolated well of the second PMOS transistor 78b.

The middle transistors 94a, 94b, 94c, 94d, 102a, 102b, 102c and 102d are turned on and off according to a first number stored in a first group of address latches 104a, 104b, 104c and 104d. The first number determines the back gate bias voltage Vcc+ and Vcc− applied to the isolated wells of the first and second PMOS transistors 78a and 78b. A fifth address latch 104e controls the lower transistors 92 and 100 so that either positive or negative correction can be performed. The coarse calibration circuit 74 can control the back gate bias voltage Vcc+ and Vcc− to as many as 25 different levels.

Figure 7:
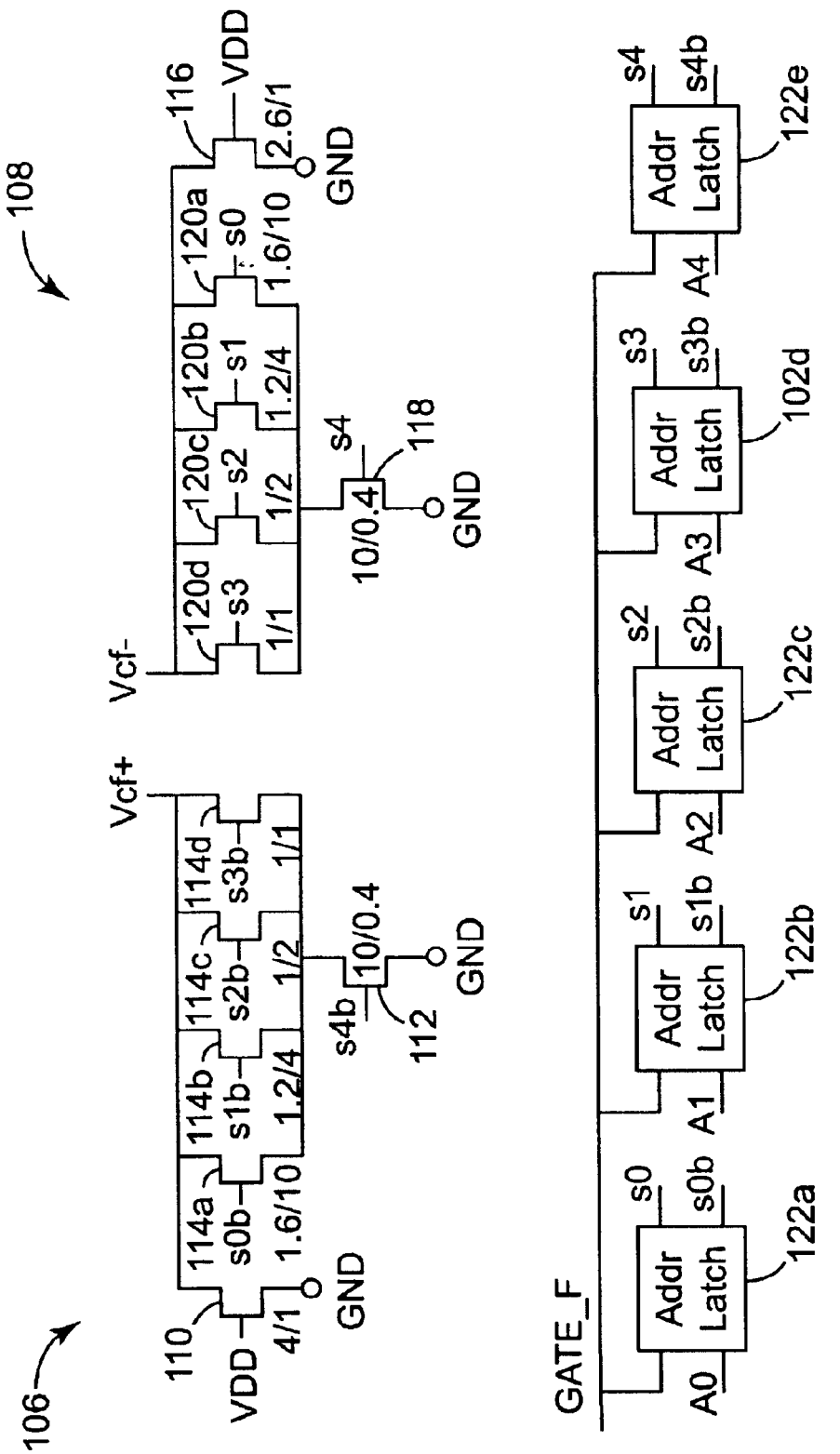
FIG. 7 is a diagram illustrating one embodiment of a fine calibration circuit for the amplifier illustrated in FIG. 5.

FIG. 7 is a diagram illustrating one embodiment of a fine calibration circuit 76 for the amplifier illustrated in FIG. 5. The fine calibration circuit 76 includes first and second programmable circuits 106 and 108 which combine with the first and second NMOS transistors 78c and 78d, respectively, to form first and second current mirrors. The programmable circuit 106 is shown, by way of example, as being formed by a first pair of transistors 110 and 112, and four middle transistors 114a, 114b, 114c and 114d having different drain to source path resistances. Turning on different combinations of the middle transistors 114a, 114b, 114c and 114d will change the impedance levels in the first current mirror.

The second current mirror 108 is also shown, by way of example, as being formed by a second pair of transistors 116 and 118, and four middle transistors 120a, 120b, 120c and 120d having different drain to source path resistances. Turning on different combinations of the middle transistors 120a, 120b, 120c and 120d will change the impedance level in the second current mirror.

During the normal mode of operation, the middle transistors 114a, 114b, 114c, 114d, 120a, 120b, 120c and 120d are turned on and off according to a second number stored in a second group of static latches 122a, 122b, 122c and 122d. The second number determines the impedance of the transistors 78a, 78b, 78c, 78d and 78e in the differential amplifier. A fifth latch 122e controls the transistors 112 and 118 so that either positive or negative correction can be performed. The fine calibration circuit 76 can control the transistor impedance to as many as 25 different levels.

Referring back to FIG. 5, the direct injection charge amplifier 34 includes a calibration control circuit 90, a test current source 92 and a counter 94 for determining the first and second numbers that should be stored in the coarse and fine calibration circuits 74 and 76. During a calibration mode of operation, the test current source 92 supplies a test current Itest to a node K. The magnitude of the test signal current Itest can be selected to be approximately the value of the expected output signal current Iout in the absence of offset error.

At the start of the calibration mode, the counter 94 begins counting from zero. The count is supplied to the latches 104a to 104e and 122a to 122e of the coarse and fine calibration circuits 74 and 76 via a control bus A0:A5. Coarse calibration is performed when the most significant bit A5 of the count is low, and fine calibration is performed when the most significant bit A5 is high. Each time the count is incremented during coarse calibration, the level of the back gate bias voltage Vcc+ and Vcc− is changed. While the back gate bias voltage Vcc+ and Vcc− is being changed, a voltage excursion at the node K is examined. When the test current Itest is greater than the output current Iout of the direct injection charge amplifier 34, the voltage Vtest at the node K is pulled high. When the test current Itest is less than or equal to the output current Iout, the voltage Vtest at the node K is pulled low. When the node K goes from high to low or vice-versa, the voltage excursion at the node K is large enough to serve as a logic input to CMOS logic gates in the calibration control circuit 90. When this voltage excursion occurs (that is, the new count causes the back gate bias voltage to change such that Itest is less than or equal to Iout), the number that caused the voltage excursion is held in the latches 104a to 104e of the coarse calibration circuit 74. That number will be used to set the back gate bias voltage Vcc+ and Vcc−.

The number held in the latches 104a to 104e of the coarse calibration circuit 74 is used to set the back gate bias voltage Vcc+ and Vcc− during fine calibration. As the count is further incremented (and bit A5=0), the number stored in the latches 104a to 104e does not change. After the count has reached 25, the next increment causes the most significant bit A5 to go high, the remaining bits A0 to A4 to go low, and the fine calibration to begin. The initial level of the test current Itest is less than the output current Iout. Each time the count is incremented during fine calibration, the transistor impedance is changed to a new level. When another large voltage excursion occurs (due to the new count causing the transistor impedance to change such that that Itest is greater than or equal to Iout), the number that caused the voltage excursion is held in the latches 122a to 122e of the fine calibration circuit 76. That number will be used to set the transistor impedance.

Figure 8:
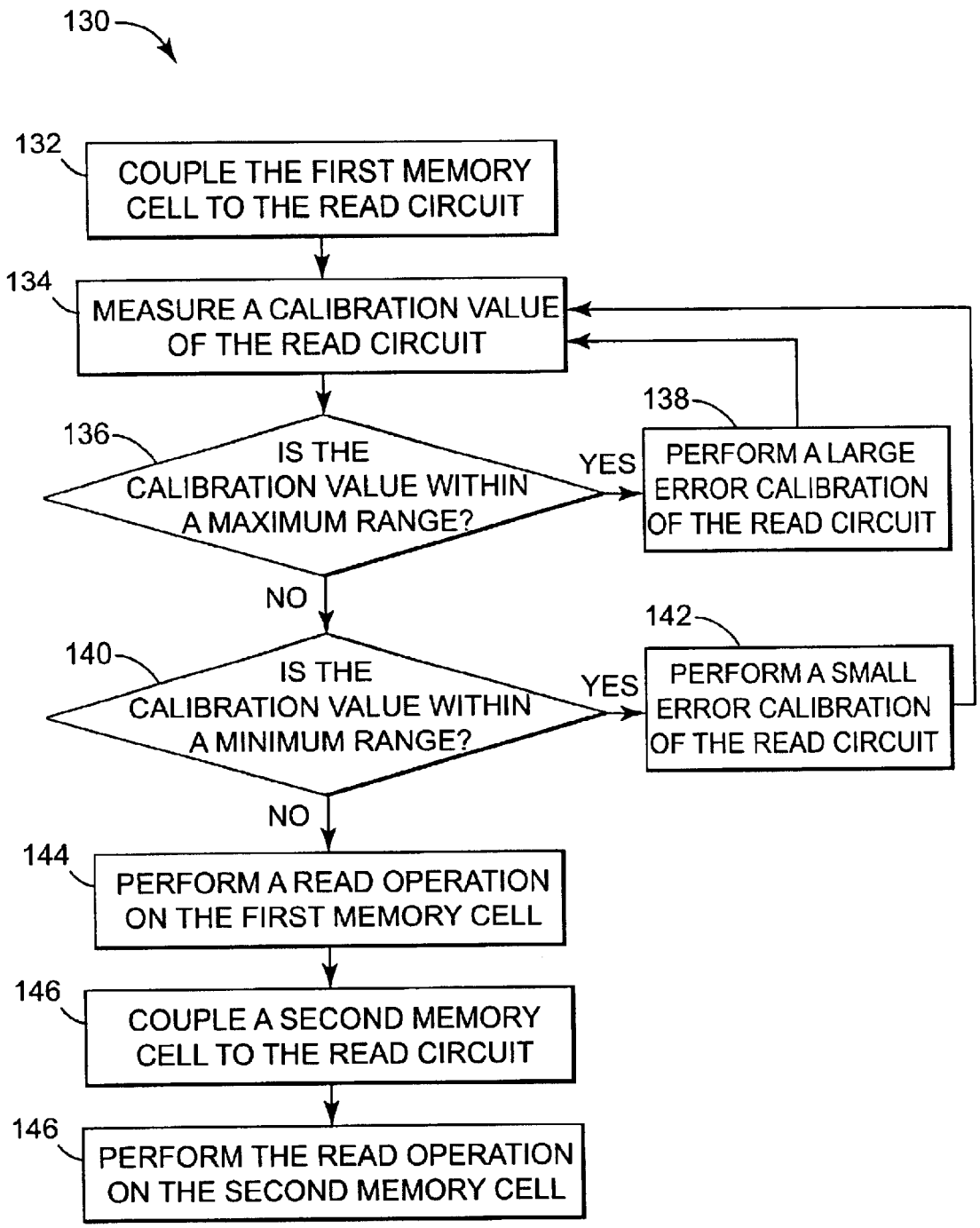
FIG. 8 is a flowchart illustrating an exemplary embodiment of a method of calibrating a read circuit.

FIG. 8 is a flowchart illustrating an exemplary embodiment of a method of calibrating a read circuit 46. The flow chart is illustrated at 130. The exemplary method illustrates the calibration of the read circuit 46 in a magnetic memory 10 which includes a first memory cell 14 and a second memory cell 14.

The method at 132 couples the first memory cell 14 to the read circuit 46. In one embodiment, the first memory cell 14 is a selected first memory cell 14. In one embodiment, the selected first memory cell 14 is intersected by a selected word line 16 and a selected bit line 18. In one embodiment, the selected word line 16 is selected by applying a first potential to the selected word line 16 and the selected bit line 18 is selected by applying a second potential to the selected bit line 18. In one embodiment, the first potential is a ground potential and the second potential is an array voltage potential.

The method at 134 measures a calibration value of the read circuit 46. In one embodiment, the read circuit 46 includes an integrator 38. In one embodiment, the calibration value is measured by measuring an amount of time for a voltage on integrator 38 to decay to a reference voltage. In this embodiment, the calibration value corresponds to the time.

The method at 136 determines if the calibration value is within a maximum range. In one embodiment, the maximum range includes a maximum upper threshold value and a maximum lower threshold value. In this embodiment, the calibration value is within the maximum range if the calibration value is greater than the maximum upper threshold value or less than the maximum lower threshold value.

If the calibration value is within the maximum range, the method at 138 performs a large error calibration of the read circuit 46.

In one embodiment, the large error calibration includes performing a coarse calibration of the direct injection charge amplifier 34 and performing a fine calibration of the direct injection charge amplifier 34. In this embodiment, the direct injection charge amplifier 34 has at least one transistor in an isolated well.

Performing the coarse calibration includes first generating a test signal. Next, an input signal is supplied to the direct injection charge amplifier 34. An output signal of the direct injection charge amplifier 34 is compared to the test signal. Next, a back gate bias voltage of the isolated well is adjusted.

Performing the fine calibration includes adjusting an impedance of the transistor. Next, a number that corresponds to the back gate bias voltage and the transistor impedance that causes the output signal to be within an acceptable limit of the test signal is stored.

After the large error calibration of the read circuit 46 is performed at 138, the calibration value of the read circuit 46 is measured at 134. If the calibration value is not within the maximum range, the method at 140 determines if the calibration value is within a minimum range. In one embodiment, the minimum range includes a minimum upper threshold value and a minimum lower threshold value. In this embodiment, the calibration value is within the minimum range if the calibration value is equal to or greater than the maximum lower threshold value and less than the minimum lower threshold value, or is greater than the minimum upper threshold value and equal to or less than the maximum upper threshold value.

If the calibration value is within the minimum range, the method at 142 performs a small error calibration of the read circuit 46.

In one embodiment, the small error calibration includes performing a fine calibration of the direct injection charge amplifier 34. In one embodiment, performing the fine calibration includes first generating a test signal. Next, an input signal is supplied to the direct injection charge amplifier 34. An output signal of the direct injection charge amplifier 34 is compared to the test signal. Next, an impedance of one or more transistors is adjusted. Next, a number that corresponds to the transistor impedance that causes the output signal to be within an acceptable limit of the test signal is stored.

After the small error calibration of the read circuit 46 is performed at 142, the calibration value of the read circuit 46 is measured at 134. If the calibration value is not within the minimum range, the method at 144 performs a read operation on the first memory cell 14.

The method at 146 couples the second memory cell 14 to the read circuit 46. In one embodiment, the second memory cell 14 is a selected second memory cell 14. In one embodiment, the selected second memory cell 14 is intersected by a selected word line 16 and a selected bit line 18. In one embodiment, the selected bit line 18 for the selected second memory cell 14 and the selected first memory cell 14 is the same selected bit line 18. In one embodiment, the selected word line 16 is selected by applying a first potential to the selected word line 16. The selected bit line 18 is selected by applying a second potential to the selected bit line 18. In one embodiment, the first potential is a ground potential and the second potential is an array voltage potential.

After the second memory cell is coupled to the read circuit, the method at 146 performs a read operation on the second memory cell 14.

What is claimed is:

1. A method of calibrating a read circuit in a magnetic memory, comprising:
   measuring a calibration value;
   performing a large error calibration of a magnetic memory cell if the calibration value is within a maximum range;
   performing a small error calibration of the magnetic memory cell if the calibration value is within a minimum range;
   performing a first read operation on the magnetic memory; and
   performing a second read operation on the magnetic memory.

2. The method of claim 1, further comprising measuring the calibration value after the large error calibration has been performed.

3. The method of claim 1, further comprising measuring the calibration value after the small error calibration has been performed.

4. The method of claim 1, the read circuit including an integrator, wherein measuring the calibration value comprises:
   measuring an amount of time for a voltage on the integrator to decay to a reference voltage, wherein the calibration value corresponds to the time.

5. The method of claim 1, wherein performing the large error calibration comprises:
   performing a coarse calibration of the read circuit; and
   performing a fine calibration of the read circuit.

6. The method of claim 5, the read circuit including a direct injection charge amplifier having at least one transistor in an isolated well, wherein performing the coarse calibration comprises:
   generating a test signal;
   supplying an input signal to the direct injection charge amplifier;
   comparing an output signal of the direct injection charge amplifier to the test signal; and
   adjusting a back gate bias voltage to the isolated well.

7. The method of claim 6, wherein performing the fine calibration comprises:
   adjusting a transistor impedance; and
   storing a number that corresponds to the back gate bias voltage and the transistor impedance that causes the output signal to be within an acceptable limit of the test signal.

8. The method of claim 1, wherein performing the small error calibration comprises:
   performing a fine calibration of the read circuit.

9. The method of claim 8, the read circuit including a direct injection charge amplifier, wherein performing the fine calibration comprises:
   generating a test signal;
   supplying an input signal;
   comparing an output signal to the test signal;

adjusting a transistor impedance; and storing a number that corresponds to the transistor impedance that causes the output signal to be within an acceptable limit of the test signal.

10. A method of calibrating a read circuit in a magnetic memory, comprising:

measuring a calibration value;

performing a large error calibration of a magnetic memory cell if the calibration value is within a maximum range;

performing a small error calibration of the magnetic memory cell if the calibration value is within a minimum range;

performing a first read operation on the magnetic memory;

performing a second read operation on the magnetic memory; and the read circuit including an integrator, wherein measuring the calibration value comprises;

measuring an amount of time for a voltage on the integrator to decay to a reference voltage, wherein the calibration value corresponds to the time, wherein the maximum range includes a maximum upper threshold value and a maximum lower threshold value, and wherein the large error calibration is performed if the calibration value is greater than the maximum upper threshold value or less than the maximum lower threshold value.

11. The method of claim 10 wherein the minimum range includes a minimum upper threshold value and a minimum lower threshold value, and wherein the small error calibration is performed if the calibration value is equal to or greater than the maximum lower threshold value and less than the minimum lower threshold value, or is greater than the minimum upper threshold value and equal to or less than the maximum upper threshold value.

12. A method of calibrating a read circuit in a magnetic memory which includes an array of bit lines extending in a first direction which intersect an array of memory cells and an array of word lines extending in a second direction which intersect the array of memory cells, wherein a number of word lines in the array of word lines is equal to or greater than M, comprising:

selecting, for (i) equal to one, an (i) word line from the array of word lines and one bit line from the array of bit lines which intersect an (i) memory cell from the array of memory cells;

measuring a calibration value;

performing a large error calibration if the calibration value is greater than a maximum upper threshold value or less than a maximum lower threshold value;

performing a small error calibration if the calibration value is equal to or greater than the maximum lower threshold value and less than a minimum lower threshold value, or is greater than a minimum upper threshold value and equal to or less than the maximum upper threshold value; and performing a read operation on the first memory cell;

for each value of (i) for $2 \leq i \leq M$;

selecting the (i) word line from the array of word lines and the one bit line from the array of bit lines which intersect the (i) memory cell from the array of memory cells; and performing a read operation on the (i) memory cell.

13. The method of claim 12, further comprising measuring the calibration value after the large error calibration has been performed.

14. The method of claim 12, further comprising measuring the calibration value after the small error calibration has been performed.

15. The method of claim 12, the read circuit including an integrator, wherein measuring the calibration value comprises:

measuring an amount of time for a voltage on the integrator to decay to a reference voltage, wherein the calibration value corresponds to the time.

16. The method of claim 12, wherein performing the large error calibration comprises:

performing a coarse calibration of the read circuit; and performing a fine calibration of the read circuit.

17. The method of claim 16, the read circuit including a direct injection charge amplifier having at least one transistor in an isolated well, wherein performing the coarse calibration comprises:

generating a test signal;

supplying an input signal to the direct injection charge amplifier;

comparing an output signal of the direct injection charge amplifier to the test signal; and adjusting a back gate bias voltage to the isolated well.

18. The method of claim 17, wherein performing the fine calibration comprises:

adjusting a transistor impedance; and storing a number that corresponds to the back gate bias voltage and the transistor impedance that causes the output signal to be within an acceptable limit of the test signal.

19. The method of claim 12, wherein performing the small error calibration comprises:

performing a fine calibration of the read circuit.

20. The method of claim 19, the read circuit including a direct injection charge amplifier, wherein performing the fine calibration comprises:

generating a test signal;

supplying an input signal;

comparing an output signal to the test signal;

adjusting a transistor impedance; and storing a number that corresponds to the transistor impedance that causes the output signal to be within an acceptable limit of the test signal.

21. The method of claim 12, wherein selecting the (i) word line from the array of word lines and the one bit line from the array of bit lines which intersect the (i) memory cell from the array of memory cells includes:

applying a first potential to the (i) word line from the array of word lines; and applying a second potential to the one bit line from the array of bit lines, wherein the first potential is a ground potential and the second potential is an array voltage potential.

22. A magnetic random access memory comprising:

a magnetic memory cell;

a read circuit for performing a read operation to the memory cell;

a control circuit configured to calibrate the read circuit including measuring a calibration of the magnetic memory cell, and performing a large error calibration if the calibration value is within a maximum range.

23. The magnetic memory of claim 22, where the control circuit is configured to perform a small error calibration if the calibration value is within a minimum range.

24. A magnetic random access memory comprising:

a magnetic memory cell;

a read circuit for performing a read operation to the memory cell;

a control circuit configured to calibrate the read circuit including measuring a calibration of the magnetic memory cell, and performing a large error calibration if the calibration value is within a maximum range, the read circuit comprising an integrator, and where the control circuit is configured to measure the amount of time for a voltage decay on the integrator to decay to a reference voltage, where the calibration value corresponds to the time.

25. A magnetic random access memory comprising:

a magnetic memory cell;

a read circuit for performing a read operation to the memory cell;

a control circuit configured to calibrate the read circuit including measuring a calibration of the magnetic memory cell, and performing a large error calibration if the calibration value is within a maximum range, the read circuit comprising a direct injection charge amplifier having at least one transistor in an isolated well and where the control circuit is configured to perform the coarse calibration by generating a test signal, supplying an input signal to the direct injection charge amplifier, comp0aring an output signal of the direct injection charge amplifier to the test signal, and adjusting a back gate bias voltage to the isolated well.

26. A magnetic random access memory comprising:

a magnetic memory cell;

a read circuit for performing a read operation to the memory cell;

a control circuit configured to calibrate the read circuit including measuring a calibration of the magnetic memory cell, and performing a large error calibration if the calibration value is within a maximum range, the read circuit including a direct injection charge amplifier used for performing the fine calibration.

* * * * *